United States Patent [19]
Dawson

[11] Patent Number: 6,057,603
[45] Date of Patent: May 2, 2000

[54] FABRICATION OF INTEGRATED CIRCUIT INTER-LEVEL DIELECTRICS USING A STOP-ON-METAL DIELECTRIC POLISH PROCESS

[75] Inventor: Robert Dawson, Austin, Tex.

[73] Assignee: Advanced Micro Devices, Inc., Sunnyvale, Calif.

[21] Appl. No.: 09/126,356

[22] Filed: Jul. 30, 1998

[51] Int. Cl.[7] .................................................. H01L 23/48
[52] U.S. Cl. ......................... 257/758; 257/763; 257/764
[58] Field of Search ................................. 257/758, 763, 257/760, 637, 764, 768, 770, 522, 508; 438/622

[56] References Cited

U.S. PATENT DOCUMENTS

| | | | |
|---|---|---|---|
| 5,548,159 | 8/1996 | Jeng | 257/634 |
| 5,589,712 | 12/1996 | Kawashima et al. | 257/750 |
| 5,702,564 | 12/1997 | Shen | 156/643.1 |

*Primary Examiner*—Tom Thomas
*Assistant Examiner*—Thien F Tran

[57] ABSTRACT

A dielectric gap fill layer is deposited on a patterned metal layer, and planarized to enable controlling the thickness of a cap layer subsequently deposited therein with improved precision. A cap layer, having a substantially flat upper surface, is then deposited on the planarized gap fill layer. The patterned metal layer can include a graded Ti/TiN ARC for increased selectivity to the gap fill dielectric layer.

10 Claims, 4 Drawing Sheets

FABRICATION OF INTEGRATED CIRCUIT INTER-LEVEL DIELECTRICS USING A STOP-ON-METAL DIELECTRIC POLISH PROCESS

FIELD OF THE INVENTION

The invention relates to semiconductor devices and, more specifically, to a method of fabricating integrated circuits with inter-level dielectrics.

BACKGROUND OF THE INVENTION

Integrated circuits are typically fabricated from one or more layers of different materials. Some layers, such as polysilicon, are used to form semiconductor devices while other layers, such as patterned metal layers, provide electrical connections between semiconductor devices. Typical integrated circuits include multiple patterned metal layers, with intervening inter-level dielectric (ILD) layers to electrically insulate the metal layer.

The selection of a particular ILD depends upon the performance, density and reliability requirements of a particular semiconductor circuit. Ideal ILDs are contamination and defect free, exhibit a low dielectric constant that approaches unity, have a sufficiently high field strength, provide a good barrier to sodium ions (Na+) and provide infinite etch selectivity to underlying materials such as silicides, silicon and polysilicon. ILDs must also conform to different topographies, such as steps and gaps, exhibit good adhesion to the underlying and overlying layers and be capable of planarization. However, in fabricating ultra high density semiconductor devices which include tightly packed, high aspect ratio metal patterns, it is difficult to satisfactorily fill the gaps with and effect planarization of a deposited dielectric material. For example, many conventional semiconductor dielectric deposition techniques, such as plasma-enhanced chemical vapor deposition (PECVD), do not adequately fill sub 0.5 micron gaps, resulting in the formation of voids which contain contaminants and adversely affect circuit performance.

A prior approach to forming ILDs involves depositing two dielectric layers. For example, a first gap filling layer of spin-on-glass (SOG), high density plasma (HDP), silicon dioxide ($SiO_2$), or other oxide, is deposited on a patterned metal layer to fill any gaps therein. Typical gap fill layers not only fill gaps but deposit a significant amount of dielectric material on top of the underlying patterned metal layer. Then a second dielectric layer, referred to as a "cap layer," is deposited on the gap fill layer. The cap layer is then planarized (leveled), as by a chemical-mechanical polishing (CMP), to provide a substantially flat upper surface on which additional layers can be formed. Such a technique is illustrated in FIGS. 1A and 1B.

Referring to FIG. 1A, a conventional integrated circuit structure is designated by the reference numeral 100. A dielectric layer 102, typically $SiO_2$, is formed on a substrate 104, typically doped monocrystalline silicon (Si). A patterned metal layer comprising one or more metal "stacks" 105 with gaps therebetween, is formed on dielectric layer 102. Conventional metal stacks 105 are comprised of a lower barrier layer 106, typically titanium (Ti), an intermediate primary conductive layer 108, typically aluminum (Al), on barrier layer 106, and an upper anti-reflective coating (ARC) 110, typically titanium-nitride (TiN), on conductive layer 108. Barrier layer 106 and ARC 110 tend to reduce electromigration in conductive layer 108, albeit at the cost of increasing sheet resistance. The total height of a metal stack 105 is typically about one micron.

Once metal stacks 105 have been formed, a gap fill layer 112, such as $SiO_2$, is deposited on dielectric layer 102 and ARC 110, to insulate metal stacks 105 from each other. Gap fill layer 112 characteristically contains peaks 114 above metal stacks 105 that typically have a height 116 above the upper surface of ARC 110 of about 1.0 to about 1.2 microns.

As illustrated in FIG. 1B, a cap layer 118 is deposited on gap fill layer 112. Cap layer 118 typically has a thickness of about 1.2 to about 1.8 microns. The upper surface 120 of cap layer 118 is not flat but contains peaks above peaks 114 on gap fill layer 112. As illustrated in FIG. 1C, cap layer 118 is then planarized as by CMP, so its upper surface 120 is substantially flat. The planarization of cap layer 118 typically removes about 0.2 to about 0.8 microns of dielectric material, leaving a cap layer 118 having a thickness of about one micron. Thus, gap fill layer 112 and cap layer 118 form an ILD 122 having a relatively smooth upper surface 120 upon which additional integrated circuit layers may be formed.

The conventional methodology illustrated in FIGS. 1A–1C suffers from drawbacks. Specifically, it is extremely difficult to control the final thickness of cap layer 118 using conventional CMP, because it is virtually impossible to determine the thickness of cap layer 118 during CMP with the requisite precision. Conventional practices measure the thickness of cap layer 118 between polishing intervals and estimate the amount of additional polishing needed to achieve a particular thickness. As such methodology is not particularly accurate, ILD 122 is often formed at a thickness greater than is desired, particularly when peaks 114 are relatively high. Thick ILDs are relatively more expensive to fabricate because of the additional amount of dielectric material employed and processing required.

Efforts have been made to reduce ILD thickness by reducing the height 116 of gap fill layer 112 by first depositing a thin PECVD film on metal stacks 105 and then etching the film with a $CF_4$ plasma. Plasma processing alters ARC 110 so that the deposition rate of gap fill layer 112 on ARC 110 is reduced, thereby reducing the height of peaks 114. However, this approach undesirably raises the dielectric constant of gap fill layer 112, which can adversely affect circuit performance.

Accordingly, there is a need for a method for fabricating integrated circuits having ILDs that avoids the problems and limitations of prior approaches. There is a particular need for a method for fabricating integrated circuits enabling relatively better control of the thickness of ILDs.

SUMMARY OF THE INVENTION

An object of the invention is a semiconductor device having an ILD with desired thickness and performance characteristics.

Another object of the invention is a method of manufacturing a semiconductor device with improved control of the ILD thickness.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to an aspect of the invention, the foregoing and other objects are achieved in part by a semiconductor device that is comprised of a substrate, a first dielectric layer formed on the substrate, a patterned metal layer having one or more gaps formed on the first dielectric layer, a second dielectric layer filling the one or more gaps and having a top surface substantially coplanar with an upper surface of the patterned metal layer and a third dielectric layer formed on the second dielectric layer.

According to another aspect of the invention, the patterned metal layer includes an upper anti-reflective coating (ARC). According to another aspect of the invention, the ARC is a TiN graded ARC that has a ratio of about 1.2 to about 1.8 Ti atoms for each N atom at the top of the ARC and a ratio of about 1.0 Ti atoms for each N atom at the bottom of the ARC.

Another aspect of the invention is a method of manufacturing a semiconductor device. The method comprises the steps of forming a first dielectric layer on a substrate, forming a patterned metal layer on the first dielectric layer, wherein the patterned metal layer includes one or more gaps, forming a second dielectric layer on the patterned metal layer filling the one or more gaps and having a top surface substantially coplanar with an upper surface of the patterned metal layer and forming a third dielectric layer on the second dielectric layer.

Additional objects and advantages of the invention will become readily apparent to those skilled in the art from the following detailed description, wherein only the preferred embodiment of the invention is shown and described, simply by way of illustration of the best mode contemplated for carrying out the invention. The invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Embodiments of the invention are illustrated by way of example, and not by way of limitation, in the figures of the accompanying drawings in which like reference numerals refer to similar elements and in which.

DETAILED DESCRIPTION OF THE PREFERRED EMBODIMENT

In accordance with the invention, an ILD for an integrated circuit is formed from a gap fill layer and a cap layer. The gap fill layer is initially deposited on a patterned metal layer filling gaps therein. The invention departs from conventional practices by planarizing the gap fill layer, as by employing stop-on-metal CMP, so that the upper surface of the gap fill layer is substantially coplanar with the upper surface of the patterned metal layer. The cap layer is then deposited on the planarized gap fill layer to form an ILD of desired thickness. Embodiments of the invention include forming a patterned metal layer having a graded TiN ARC to increase the selectivity of the stop-on-metal CMP technique to the gap fill layer relative to the graded TiN ARC.

The invention enables formation of an ILD with greater dimensional, e.g. thickness, accuracy and, hence, improved performance. Planarizing the gap fill layer enables deposition of the cap layer having a targeted thickness.

Figure 1A:
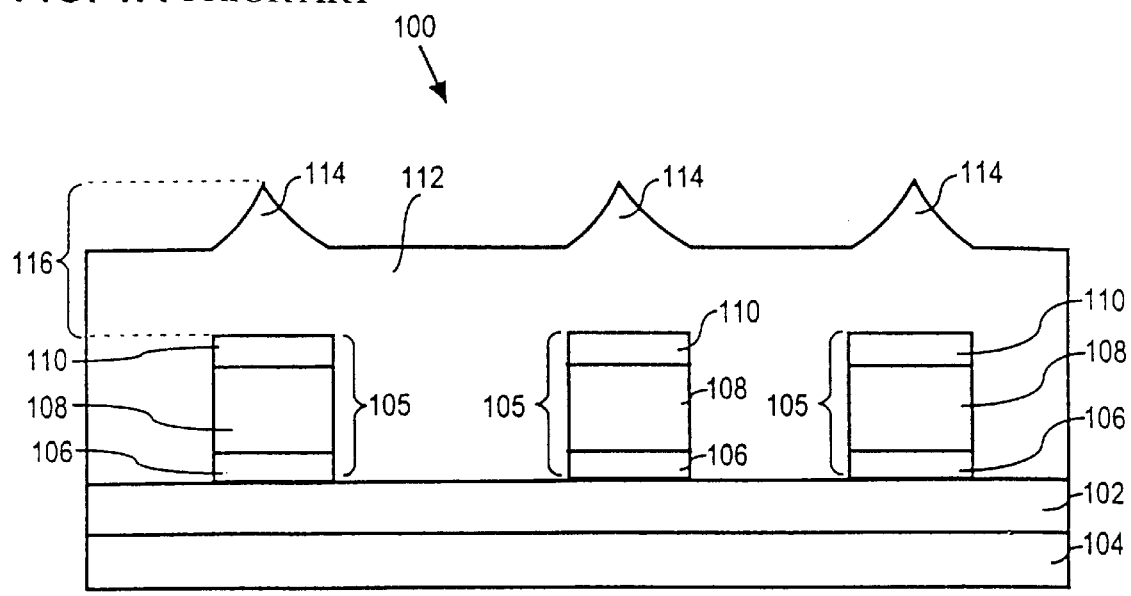
FIGS. 1A, 1B and 1C illustrate processing steps for manufacturing an integrated circuit with an ILD using conventional semiconductor fabrication techniques.
Figure 1B:
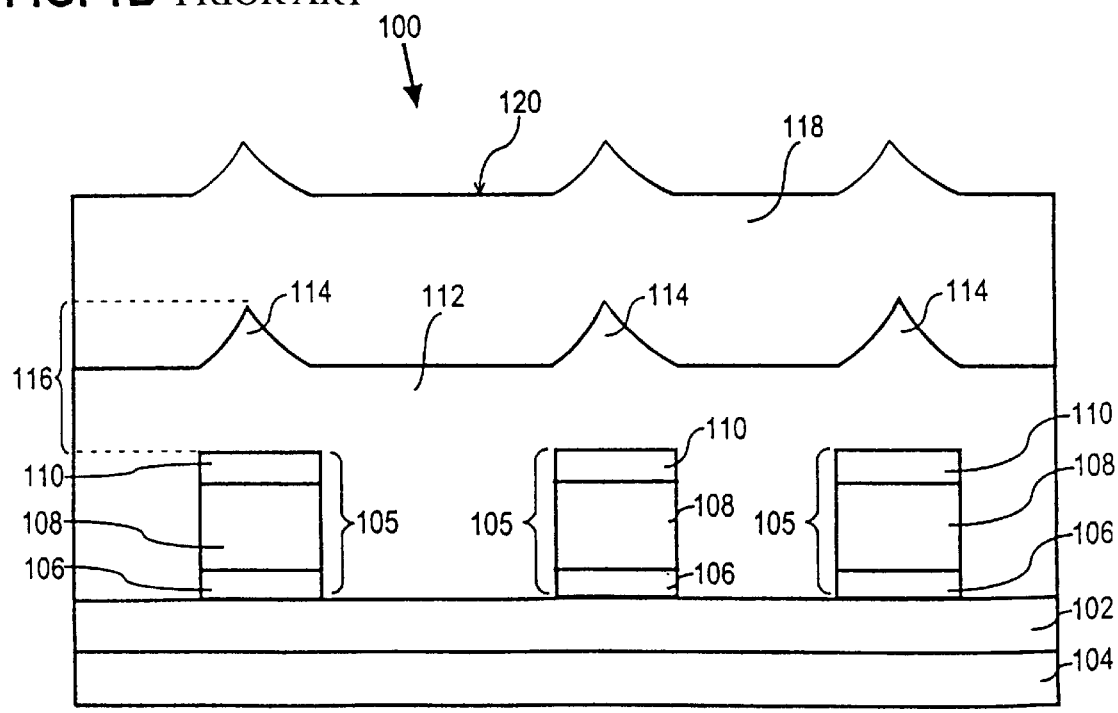
Figure 1C:
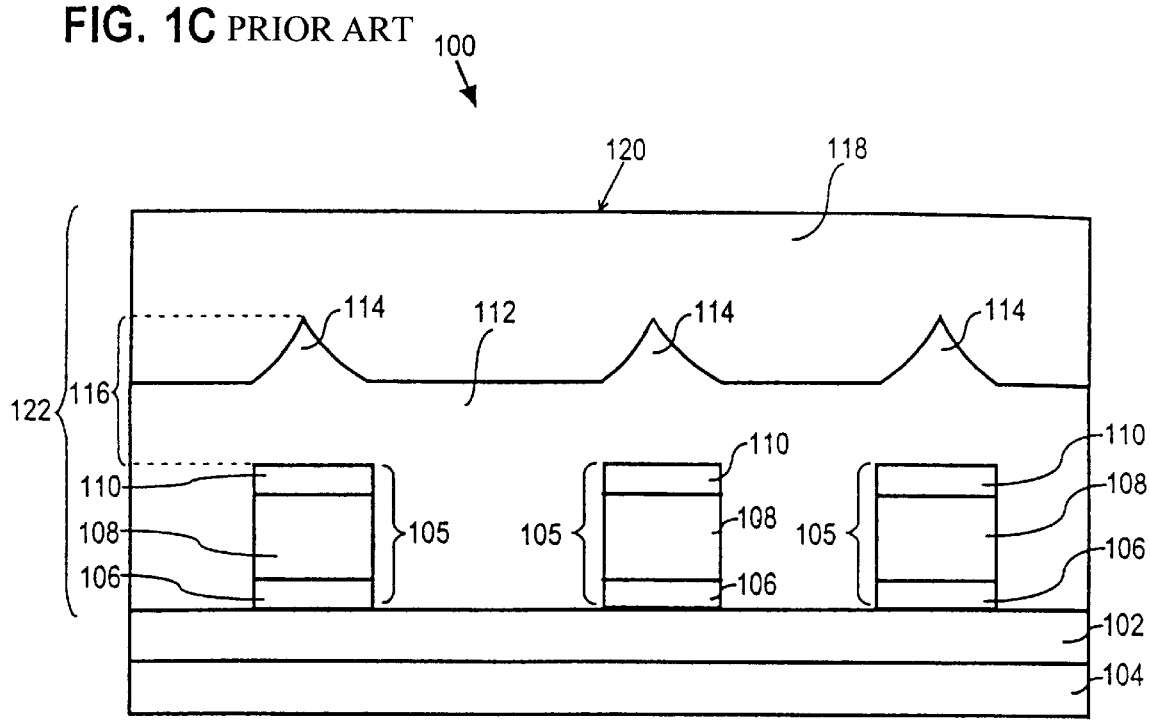
Figure 2:
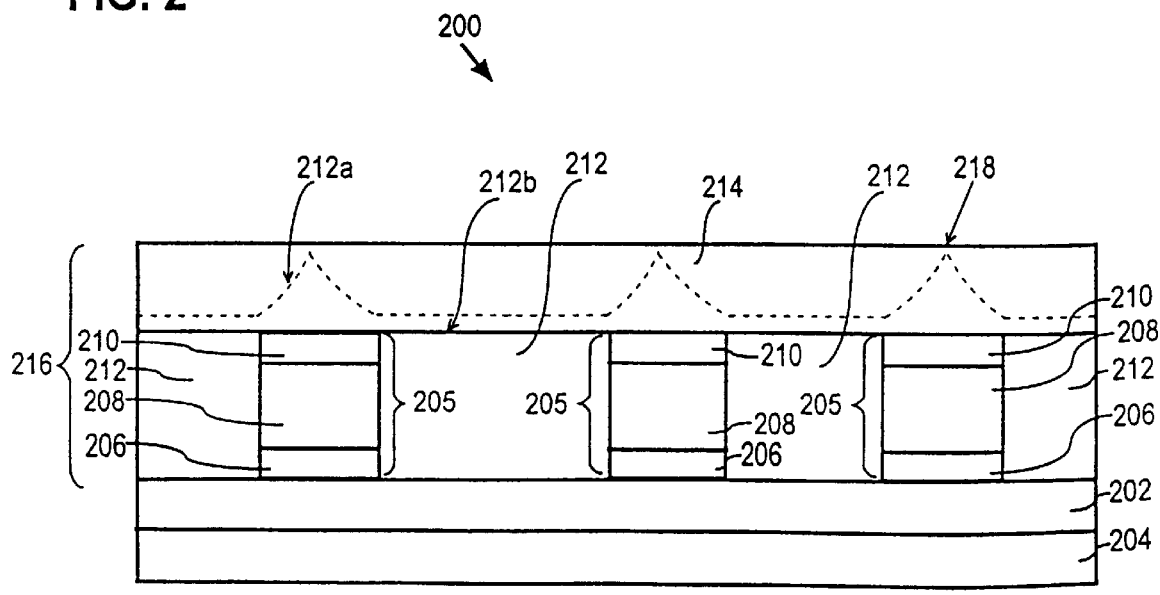
FIG. 2 schematically illustrates an integrated circuit with an ILD formed in accordance with an embodiment of the invention.

FIG. 2 schematically illustrates a semiconductor circuit 200 having an ILD formed in accordance with an embodiment of the invention. Semiconductor circuit 200 includes a dielectric layer 202 on a substrate 204. A patterned metal layer comprising one or more metal stacks 205 is formed on dielectric layer 202. Metal stacks 205 include a barrier layer 206, typically of Ti or Tungsten (W), an intermediate primary conductive layer 208, typically Al, and an ARC 210, typically Ti/TiN. Metal stacks 205 are typically patterned to form metal lines.

Circuit 200 includes a dielectric gap fill layer 212, e.g., SOG, HDP, $SiO_2$ or hydrogen silsesquioxane (HSQ), formed on dielectric layer 202 and ARC 210. Other low dielectric constant materials may be used for gap fill layer 212, for example, those described in "Low Dielectric Constant Spin-On Materials for Inter-Metal Dielectric Applications, A Comparative Study", Dr. Többen, et al. (p. 29), 1996 Dielectrics for VLSI/ULSI Conference and "Evaluation of Fluorinated Poly(arylethers) as Stand-Alone Dielectrics", C. Case, et al., 1995 PLANARIZATION (PLANAR) Conference. In depositing fill layer 212 using conventional semiconductor fabrication processes, an uneven top surface 212a results. In accordance with the invention, gap fill layer 212 is planarized as by a stop-on-metal CMP technique, until the upper surface 212a is substantially coplanar with the upper surface of the patterned metal layer, as indicated by reference numeral 212b. The original shape 212a is a function of the deposition conditions, the shape shown in the drawings being most indicative of HDP.

Circuit 200 also includes a cap layer 214 formed on gap fill layer 212. Cap layer 214 may be the same dielectric material as gap fill layer 212 or may be a different dielectric material. Since top surface 212b is substantially flat, cap layer 214 can be applied using conventional semiconductor processing deposition techniques at a targeted thickness. In addition, the top surface 218 of ILD 216 is substantially flat, thereby enabling deposition of additional layers (not illustrated) thereon.

Figure 3A:
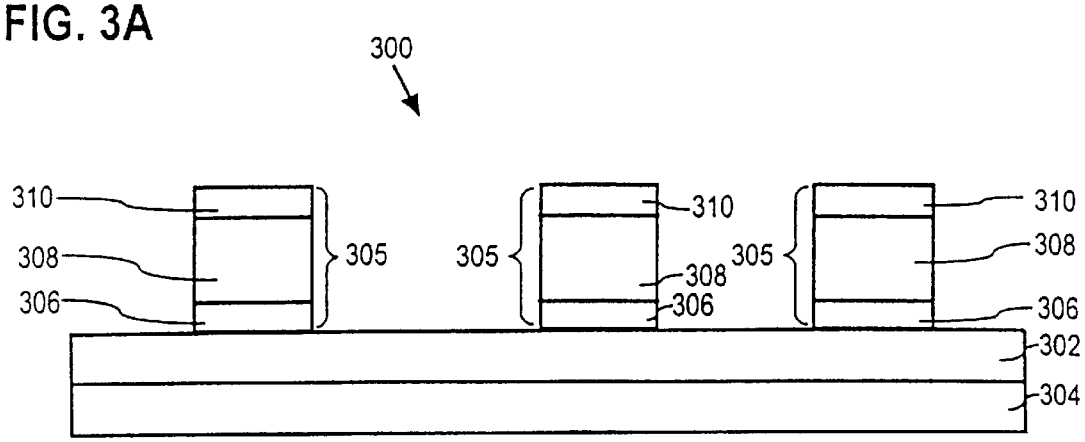
FIGS. 3A–3D illustrate relevant processing steps for manufacturing an integrated circuit with an ILD in accordance with an embodiment of the invention.

Sequential processing steps according to an embodiment of the invention are now described with reference to FIGS. 3A–3D. Referring to FIG. 3A, metal stacks 305, having a height of about 1 micron, are formed on dielectric layer 302 which, in turn, is formed on substrate 304. Metal stacks 305 are comprised of a barrier layer 306, typically Ti deposited at a thickness of about 250 to about 500 Angstroms (Å), as by conventional physical vapor deposition (PVD) or chemical vapor deposition (CVD), an intermediate metal layer 308, typically Al deposited by a conventional deposition technique at a thickness of about 6,000 Å to about 10,000 Å, and an ARC 310, typically a Ti/TiN composite layer having a thickness in the range of about 1,000 to about 1,500 Å.

Figure 3B:
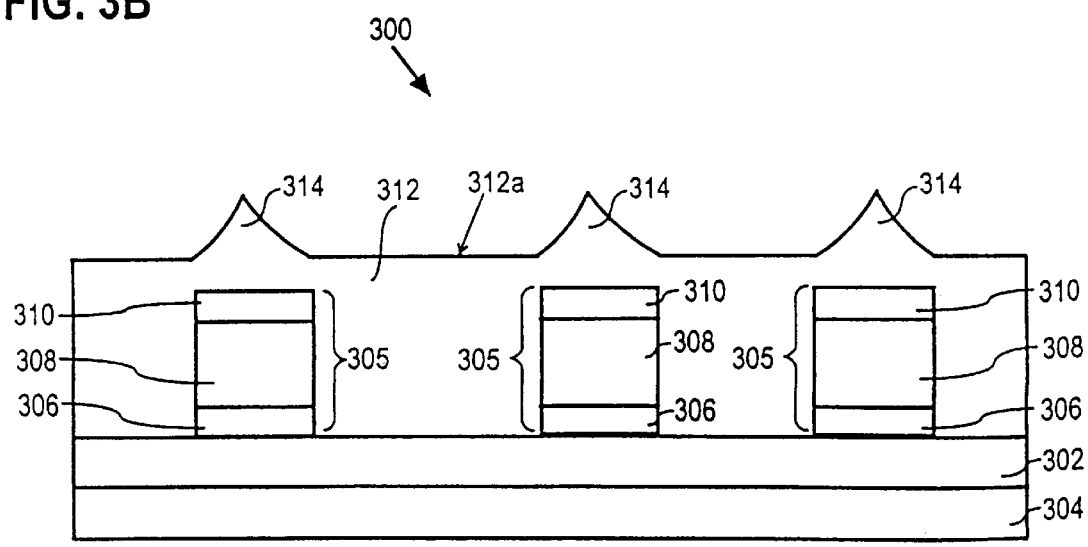

As illustrated in FIG. 3B, a gap fill layer 312 is deposited on and in between metal stacks 305. Gap fill layer 312 is comprised of any of a variety of dielectric materials, e.g., SOG, HDP, HSQ or other low dielectric constant materials. The top surface 312a of gap fill layer 312 is characteristically non-uniform and contains peaks 314 formed above the upper surface of the metal stacks 305.

Figure 3C:
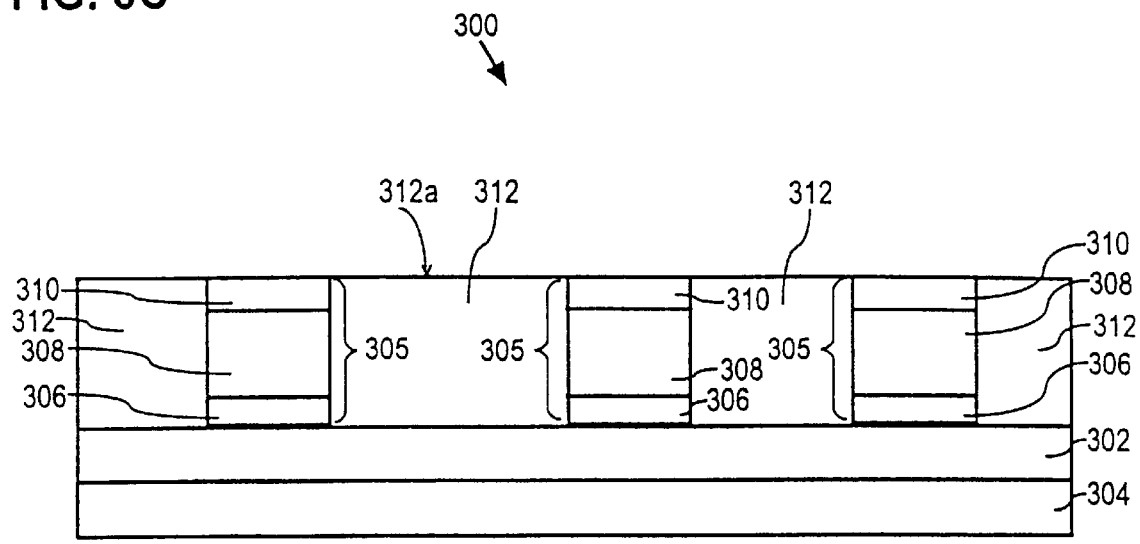

Referring to FIGS. 3B and 3C, a stop-on-metal polishing technique is then performed to remove and planarize peaks 314 and gap fill layer 312 so that top surface 312a is substantially coplanar with the upper surface of metal stack 305, i.e., the upper surface of ARC 310. Ideally, a mechanical polish or (CMP) technique having a high selectivity to the dielectric material of gap fill layer 312 relative to the material of ARC 310 is employed so that the process will stop on ARC 310. Most conventional ARC materials, for example Ti or TiN, have a relatively low polish rate compared to conventional gap fill layer dielectric materials, e.g. $SiO_2$, thereby enabling planarization of gap fill layer 312 substantially coplanar to ARC 310. For example, a difference in coefficients of friction between the dielectric material used for gap fill layer 312 and the material used for ARC 310 enables detecting a change in the motor current of a polisher upon reaching ARC 310 so that a CMP is stopped on ARC 310. The particular slurry selected for the CMP process depends upon the dielectric material of gap fill layer 312. Conventional slurries have a pH of about 10, which is suitable for many dielectric materials. However, upon employing HSQ for the gap fill layer 312, a CMP slurry having a pH of about 8–9 has been found suitable.

Figure 3D:
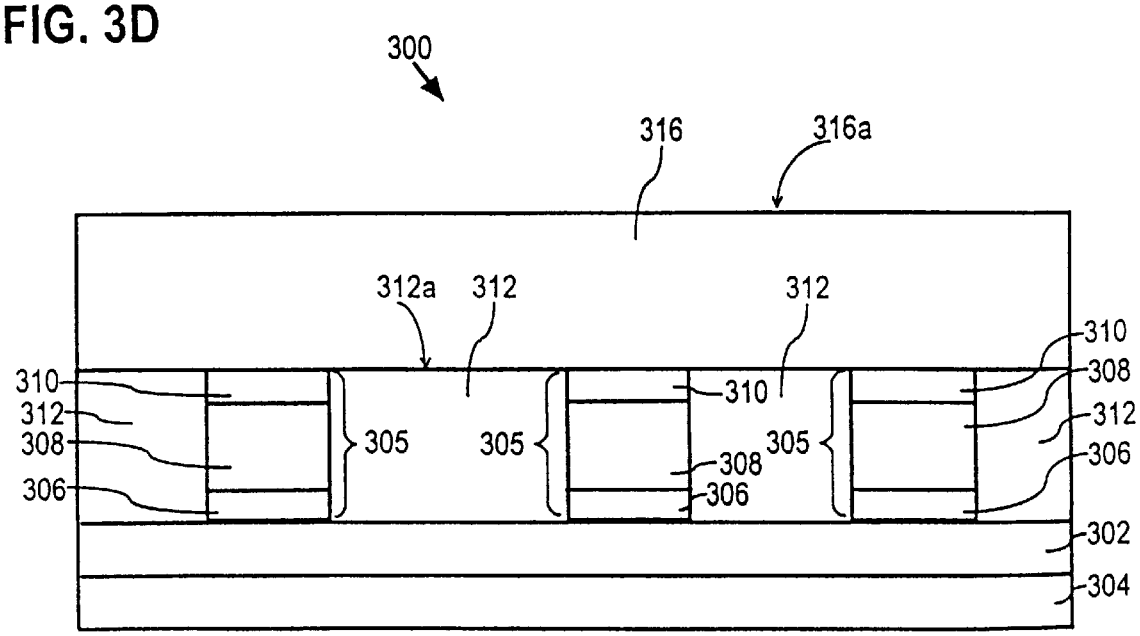

Referring to FIG. 3D, after planarizing gap fill layer 312, a cap layer 316, having a thickness of about one micron, is deposited on gap fill layer 312 and ARC 310 using a conventional deposition technique. Since the upper surface 312a is substantially flat, cap layer 316 can easily be formed at the targeted thickness without requiring planarization. In addition, cap layer 316 can be deposited with a substantially flat top surface which enables additional layers to be deposited thereon (not illustrated) without requiring planarization. Regardless of whether cap layer 316 is the same or different material as gap fill layer 312, a discernable interface is formed between cap layer 316 and gap fill layer 312 at top surface 312a.

In another embodiment of the invention, ARC 310 is comprised of a graded TiN layer thereby further increasing the selectivity of CMP to gap fill layer 312, with respect to the graded TiN ARC 310. The graded TiN ARC 310 has a higher ratio of Ti atoms to N atoms at the top portion (closest to cap layer 316) compared to the bottom portion (closest to metal layer 308), for increased selectivity. For example, it has been determined that a ratio of about 1.2 to about 1.8 Ti atoms for each N atom at the top of ARC 310 significantly increases the selectivity of CMP processes to gap fill layer 312 with respect to graded TiN ARC 310, since Ti provides greater resistance to conventional CMP slurries than TiN. Essentially, conventional CMP slurries polish TiN better than Ti. Thus, an ARC 310 with a top surface having a relatively high ratio of Ti to N is considerably more resistant to CMP than gap fill layer 312 selectivity, thereby reducing the amount of ARC 310 removed during planarization. A graded ARC 310 having a thickness in the range of about 800 Å to about 1200 Å has been found suitable.

Conventional semiconductor deposition processes can be used to form graded TiN ARC 310, for example, by PVD using a Ti target with a nitrogen-argon ambient for the sputtering gas. A Ti-rich TiN film may be used so there is more Ti than N in contact with metal layer 308 during the deposition process.

In another embodiment of the invention, a separate Ti layer is formed on ARC 310 to provide a polish stop. A Ti layer having a thickness in the range of about 50 Å to about 500 Å has been found to be suitable. Preferably a Ti layer having a thickness in the range of about 100 Å to about 200 Å is used.

Embodiments of the invention have been described (and illustrated) in the context of a single ILD. However, embodiments of the invention are applicable to semiconductor devices having any number of ILDs. In addition, although embodiments of the invention have been described in the context of employing stop-on-metal CMP using an ARC as the polish endpoint of the invention is applicable to patterned metal layers that do not have an ARC.

The invention is applicable to the manufacture of various types of semiconductor devices, particularly ultra high-density devices with sub-micron features. The invention provides several advantages over prior approaches for fabricating integrated circuits with ILDs. Embodiments of the invention provide better control over the thickness of ILDs than conventional practices thereby enabling formation of thinner ILDs at a uniform thickness and reducing the amount of dielectric material required. Thus, the invention enables reduction of manufacturing costs and processing time. Moreover, processing time can be additionally reduced employing a stop-on-metal CMP, by avoiding measurements between polishing intervals.

In the previous description, specific details have been set forth, such as specific materials, structures, chemicals, processes, etc., in order to provide a thorough understanding of the invention. However, it will be apparent that the invention may be practiced without these specific details. In other instances, well-known processing structures have not been described in detail in order to avoid unnecessarily obscuring the invention.

In addition, although the invention has been described with reference to specific embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. A semiconductor device comprising:

a substrate;

a first dielectric layer formed on the substrate;

a patterned metal layer having one or more gaps formed on the first dielectric layer, the patterned metal layer having an anti-reflective coating comprising a second dielectric layer filling each of the one or more gaps and having a top surface substantially coplanar with an upper surface of the patterned metal layer; and a third dielectric layer formed on the second dielectric layer.

2. The semiconductor device of claim 1, wherein the ARC has a thickness of about 800 Å to about 1200 Å.

3. The semiconductor device of claim 1, wherein the third dielectric material comprised of a different material than the second dielectric layer.

4. The semiconductor device of claim 1, wherein the second and third dielectric layers are a material selected from the group consisting of spin-on-glass, high-density plasma, hydrogen silsesquioxane and silicon dioxide.

5. The semiconductor device of claim 4, wherein the second and third dielectric layers each have a thickness of approximately one micron.

6. A method of manufacturing the semiconductor device recited in claim 1, the method comprising:

forming a first dielectric layer on a substrate;

forming a patterned metal layer on the first dielectric layer, the patterned metal layer having one or more gaps and an anti-reflective coating comprising a graded titanium-nitride layer having a top portion with a ratio of titanium atoms to Nitrogen atoms of about 1.2 to about 1.8 and a bottom portion with a ratio of titanium atoms to Nitrogen atoms that is less than that of the top portion;

forming a second dielectric layer on the patterned metal layer filling the one or more gaps and having a top surface substantially coplanar with an upper surface of the patterned metal layer; and forming a third dielectric layer on the second dielectric layer.

7. The method of claim 6, wherein the step of forming a second dielectric layer on the patterned metal layer includes the steps of depositing a second dielectric layer on the patterned metal layer to fill the one or more gaps; and planarizing the second dielectric layer so that an upper surface of the second dielectric layer is substantially coplanar with the patterned metal layer.

8. The method of claim 7, wherein the step of planarizing the second dielectric layer so that an upper surface of the second dielectric layer is substantially coplanar with the patterned metal layer includes the step of planarizing the second dielectric layer by a chemical-mechanical polish (CMP) process having a relatively high selectivity to the second dielectric layer with respect to the patterned metal layer.

9. The method of claim 8, wherein the selectivity of the CMP to the second dielectric layer relative to the patterned metal layer is approximately 10 to 1 and 50 to 1.

10. The method of claim 8, wherein the CMP uses a slurry having a pH in the range of about 8 to about 9.

* * * * *